United States Patent
Luo et al.

(10) Patent No.: US 8,952,718 B2
(45) Date of Patent: Feb. 10, 2015

(54) TERMINATION CIRCUIT AND DC BALANCE METHOD THEREOF

(75) Inventors: Yan-Bin Luo, Taipei (TW); Sheng-Ming Chang, Sanchong (TW); Bo-Wei Hsieh, Tainan (TW); Ming-Shi Liou, Taipei (TW); Chih-Chien Hung, Hualien (TW); Shang-Ping Chen, Tai-Chung (TW)

(73) Assignee: Mediatek Inc., Hsin-Chu (TW)

( * ) Notice: Subject to any disclaimer, the term of this patent is extended or adjusted under 35 U.S.C. 154(b) by 179 days.

(21) Appl. No.: 13/572,143

(22) Filed: Aug. 10, 2012

(65) Prior Publication Data

US 2013/0113516 A1    May 9, 2013

Related U.S. Application Data

(60) Provisional application No. 61/527,345, filed on Aug. 25, 2011, provisional application No. 61/595,361, filed on Feb. 6, 2012.

(51) Int. Cl.
| H03K 19/003 | (2006.01) |
| H03K 19/00 | (2006.01) |
| G11C 7/10 | (2006.01) |
| G11C 11/4093 | (2006.01) |

(52) U.S. Cl.
CPC .............. *H03K 19/0005* (2013.01); *G11C 7/10* (2013.01); *G11C 7/1048* (2013.01); *G11C 7/1072* (2013.01); *G11C 11/4093* (2013.01)
USPC .................................. 326/30; 326/21; 326/86

(58) Field of Classification Search
USPC ........................................................... 326/30
See application file for complete search history.

(56) References Cited

U.S. PATENT DOCUMENTS

| 7,800,399 B1 | 9/2010 | Schumann | |
| 2004/0113650 A1* | 6/2004 | Cornelius | 326/30 |
| 2010/0327902 A1* | 12/2010 | Shau | 326/30 |

* cited by examiner

*Primary Examiner* — Jany Richardson
(74) *Attorney, Agent, or Firm* — McClure, Qualey & Rodack, LLP

(57) ABSTRACT

A termination circuit for a plurality of memories controlled by a controller is provided. The termination circuit includes a plurality of drivers, a plurality of resistors and a plurality of capacitors. Each of the drivers is coupled to the memories via a transmission line. Each of the resistors is coupled to the corresponding driver via the corresponding transmission line. Each of the capacitors is coupled between the corresponding resistor and a reference voltage. The controller is coupled to the memories via the drivers, and the controller provides a specific code to one of the drivers when a quantity of logic "0" and a quantity of logic "1" transmitted to the memories via the transmission line corresponding to the one of the drivers are unbalanced, so as to adjust a termination voltage of the capacitor corresponding to the one of the drivers.

25 Claims, 5 Drawing Sheets

TERMINATION CIRCUIT AND DC BALANCE METHOD THEREOF

CROSS REFERENCE TO RELATED APPLICATIONS

This application claims the benefit of U.S. Provisional Application No. 61/527,345, filed on Aug. 25, 2011, and U.S. Provisional Application No. 61/595,361, filed on Feb. 6, 2012, the entireties of which are incorporated by reference herein.

BACKGROUND OF THE INVENTION

1. Field of the Invention

The invention relates to a termination circuit, and more particularly to a termination circuit of a plurality of memories.

2. Description of the Related Art

As system bandwidths continue to increase, memory technologies have been optimized for higher speeds and performance. The next generation family of double data rate (DDR) synchronous dynamic random access memory (SDRAM) is the DDR3 SDRAM. DDR3 SDRAMs offer numerous advantages compared with DDR2 SDRAMs, such as lower operation power, higher speeds, higher performance (twice the bandwidth) and so on. Specifically, DDR3 SDRAM has reduced power consumption when compared with DDR2 SDRAM, primarily due to smaller die sizes and a lower supply voltage (e.g. 1.5V for DDR3 SDRAM versus 1.8V for DDR2 SDRAM).

Unlike DDR2 SDRAM, which uses a T-branch topology, DDR3 SDRAM adopts a fly-by topology that provides better signal integrity at higher speeds. The fly-by topology is applied in the command, address, control and clock signals for the DDR3 SDRAM. The signals from the memory controller are connected in series to each DRAM device, thereby improving signal integrity by reducing the number of stubs and the stub lengths.

A termination circuit typically provides a termination resistance to a common node of a plurality of DDR3 SDRAMs, so as to prevent degradation of signal integrity on transmission lines for the DDR3 SDRAMs. The common node may be at ground potential or at a potential half way between a ground and a supply voltage, wherein the required termination voltage can be regulated. For example, a memory termination circuit of a DDR DRAM can be required to provide a termination voltage approximately equal to one-half of a supply voltage, such as VDD, at the common node. However, conventional termination circuits, such as conventional DDR DRAM termination circuits, suffer from various disadvantages.

In a conventional termination circuit, each transmission line is driven by a driver and is coupled to a regulated voltage node. The regulated voltage node is coupled to a ground through a termination resistor and a termination voltage regulator connected in series, wherein the termination voltage regulator is a special regulator that can source and sink current. Although the termination voltage regulator can provide a precise termination voltage at the regulated voltage node, the termination voltage regulator is a separate component that can undesirably increase manufacturing costs.

Therefore, a termination circuit without any termination voltage regulator is desired.

BRIEF SUMMARY OF THE INVENTION

A termination circuit for a plurality of memories and direct current (DC) balance method thereof are provided. An embodiment of a termination circuit for a plurality of memories controlled by a controller is provided. The termination circuit comprises a plurality of drivers, a plurality of resistors and a plurality of capacitors. Each of the drivers is coupled to the memories via a transmission line. Each of the resistors is coupled to the corresponding driver via the corresponding transmission line. Each of the capacitors is coupled between the corresponding resistor and a reference voltage. The controller is coupled to the memories via the drivers, and the controller provides a specific code to one of the drivers when a quantity of logic "0" and a quantity of logic "1" transmitted to the memories via the transmission line corresponding to the one of the drivers are unbalanced, so as to adjust a termination voltage of the capacitor corresponding to the one of the drivers.

Furthermore, an embodiment of a direct current (DC) balance method for a termination circuit of a plurality of memories is provided. The termination circuit comprises a plurality of drivers coupled to the memories via a plurality of transmission lines, a plurality of resistors coupled to the corresponding driver via the corresponding transmission line, and a plurality of capacitors coupled between the corresponding resistor and a reference voltage. An input signal is decoded to obtain data having address and command information. The data is provided to the memories via the drivers. A specific code is provided to the memories via one of the drivers when a quantity of logic "0" and a quantity of logic "1" of the data provided to the memories via the one of the drivers are unbalanced, so as to adjust a termination voltage of the capacitor corresponding to the one of the drivers.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
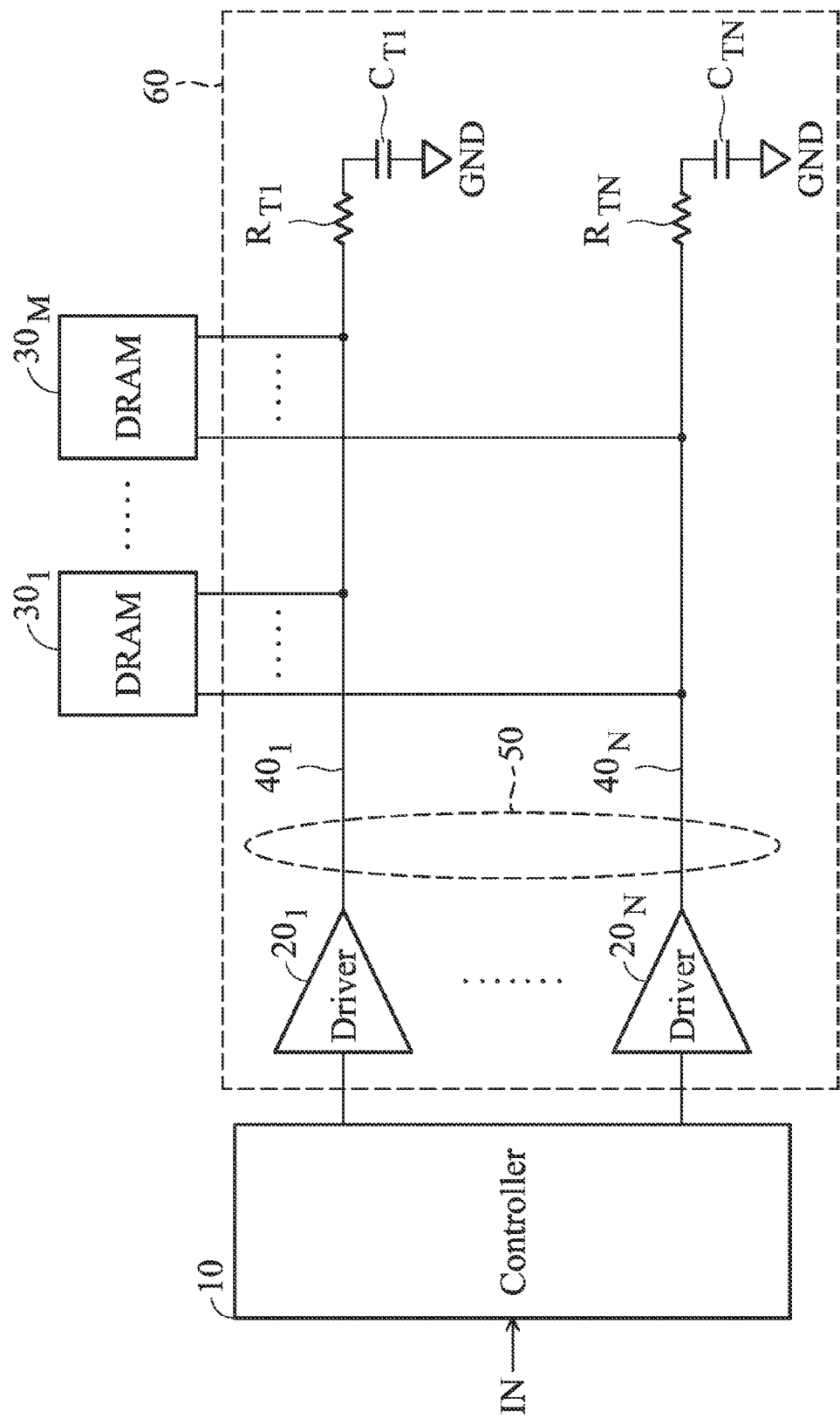
FIG. 1 shows a schematic illustrating a memory system according to an embodiment of the invention.

FIG. 1 shows a schematic illustrating a memory system according to an embodiment of the invention. The memory system comprises a controller 10, a plurality of memories $30_1$-$30_M$ and a termination circuit 60. The memories $30_1$-$30_M$ are controlled by the controller 10. Furthermore, the termination circuit 60 comprises a plurality of drivers $20_1$-$20_N$, a plurality of termination resistors $R_{T1}$-$R_{TN}$ and a plurality of termination capacitors $C_{T1}$-$C_{TN}$. According to an input signal IN, the controller 10 provides the address signals and the command signals, such as a write enable signal (WE), a column address signal (CAS), a row address signal (RAS) and a chip select signal (CS) to the memories $30_1$-$30_M$ via the drivers $20_1$-$20_N$ and a bus 50 formed by a plurality of transmission lines $40_1$-$40_N$. In the embodiment, the memories $30_1$-$30_M$ are double data rate (DDR) dynamic random access memories (DRAMs). For each of the drivers $20_1$-$20_N$, an individual termination resistor and an individual termination capacitor are used to provide a termination voltage for the corresponding signal provided by the controller 10. For example, the termination resistor $R_{T1}$ is coupled to the driver $20_1$, and the termination capacitor $C_{T1}$ is coupled between the termination resistor $R_{T1}$ and a ground GND. In one embodiment, the termination capacitor $C_{T1}$ may be coupled between the termination resistor $R_{T1}$ and a supply voltage VDD.

Typically, the DDR DRAM specification requires that a resistive line termination be terminated at a voltage (i.e. a termination voltage) that is at an approximate mid-point level between the supply voltage VDD and the ground GND. In FIG. 1, when a quantity of logic "0" and a quantity of logic "1" transmitted to the memories $30_1$-$30_M$ via one transmission line of the bus 50 are unbalanced, the controller 10 can adjust the termination voltage at the corresponding termination capacitor by providing DC balance codes to the corresponding termination capacitor via the transmission line during one or more idle cycles. The idle cycle represents a period of time that the bus 50 is not active or is driving "no operation" commands (i.e. NOP). Furthermore, the DC balance codes represent that the long-term ratio of logic "1" and logic "0" transmitted is about 50%. In other embodiments, the controller 10 may transmit scrambling codes or modulation codes during the idle cycles, to control the termination voltage at the corresponding termination capacitor.

Figure 2:
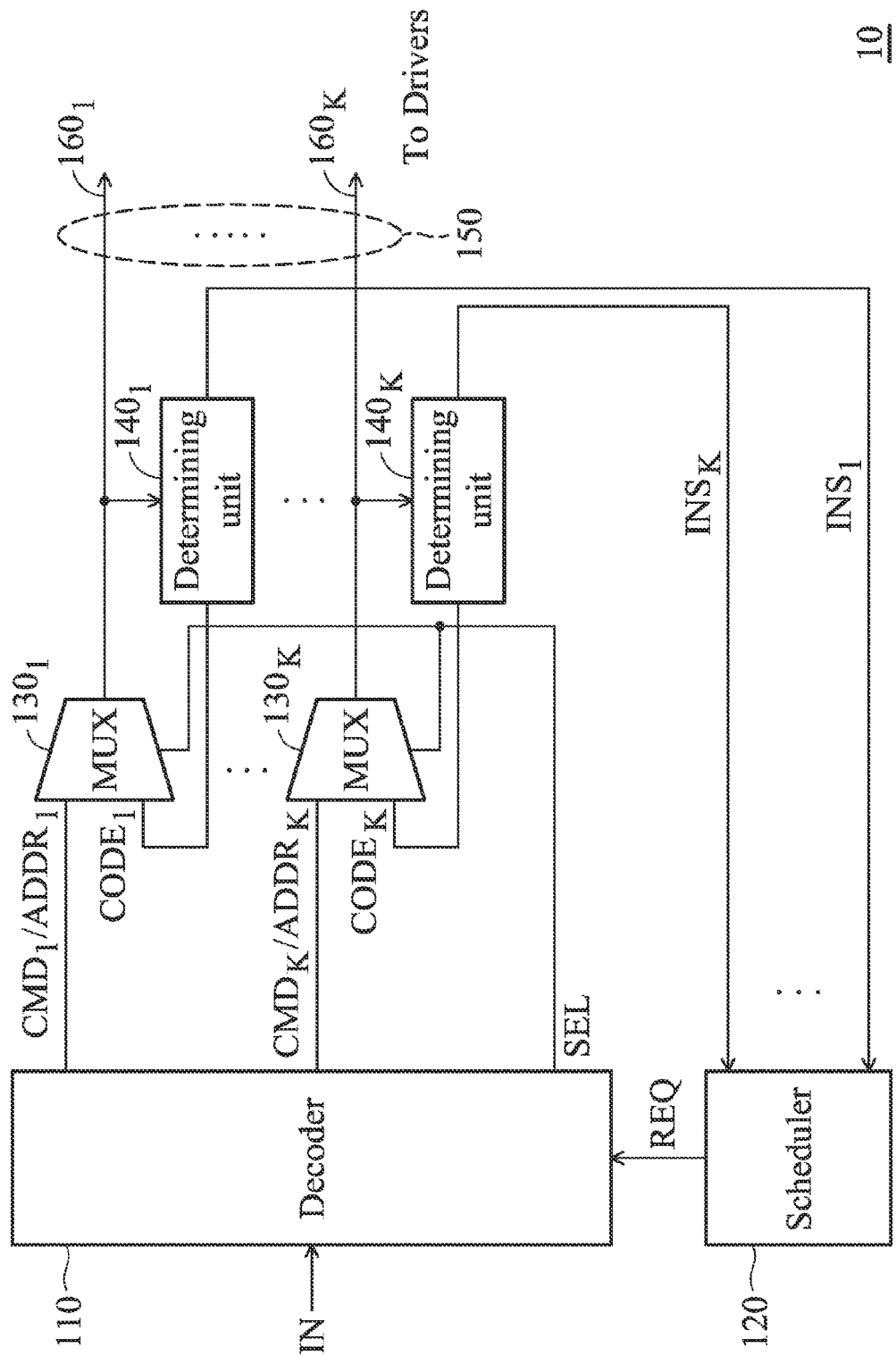
FIG. 2 shows an example schematic illustrating the controller of FIG. 1 according to an embodiment of the invention.

FIG. 2 shows an example schematic illustrating the controller 10 of FIG. 1 according to an embodiment of the invention. The controller 10 comprises a decoder 110, a scheduler 120, a plurality of selectors $130_1$-$130_K$ and a plurality of determining units $140_1$-$140_K$. In the embodiment, each of the selectors $130_1$-$130_K$ is a multiplexer (MUX). The decoder 110 is a decoder for decoding the input signal IN with a plurality of bits from other circuits (e.g. a processor), to obtain the address data $ADDR_1$-$ADDR_K$, the command data $CMD_1$-$CMD_K$ or a combination of both. The address data $ADDR_1$-$ADDR_K$ and the command data $CMD_1$-$CMD_K$ are transmitted to the drivers $20_1$-$20_M$ of FIG. 1 via a bus 150, wherein the bus 150 is formed by a plurality of transmission lines $160_1$-$160_K$. Each of the determining units $140_1$-$140_K$ is coupled to the corresponding transmission line of the bus 150 for recording the data output to the corresponding driver. For example, the determining units $140_1$ is coupled to the transmission line $160_1$ and the determining units $140_K$ is coupled to the transmission line $160_K$. Furthermore, each of the determining units $140_1$-$140_K$ may obtain a statistic value according to the recorded data thereof. Each of the determining units $140_1$-$140_K$ may provide a DC balance code to the corresponding selector. Each of the selectors $130_1$-$130_K$ selectively provides the address data $ADDR_1$-$ADDR_K$ and the command data $CMD_1$-$CMD_K$ or the DC balance code to the corresponding transmission line according to a control signal SEL. For example, once one of the statistic values indicates that a quantity of logic "0" and a quantity of logic "1" of the output data are unbalanced, the determining unit obtaining the one of the statistic values may provide an insertion signal (e.g. $INS_1, \ldots,$ or $INS_K$) to the scheduler 120. In response to the insertion signal, the scheduler 120 provides a requirement signal REQ to the decoder 110, to notify the decoder 110 that the DC balance codes need to be inserted. Thus, the decoder 110 provides the control signal SEL to control the selectors $130_1$-$130_K$, to output the DC balance codes $CODE_1$-$CODE_K$ provided by the determining units $140_1$-$140_K$, to the transmission lines $160_1$-$160_K$ of the bus 150, respectively, so as to control the termination voltages of the termination capacitors $C_{T1}$-$C_{TN}$ of FIG. 1 to revert back to an approximate mid-point level between the supply voltage VDD and the ground GND. Simultaneously, the decoder 110 stops providing the address data $ADDR_1$-$ADDR_K$ and the command data $CMD_1$-$CMD_K$ to the selectors $130_1$-$130_K$. As described above, the control signal SEL controls the selectors $130_1$-$130_K$ to provide the DC balance codes only during the idle cycles. The determining units $140_1$-$140_K$ may continuously record the data on the bus 150 and obtain the statistic values corresponding to the recorded data. Once all statistic values indicate that a quantity of logic "0" and a quantity of logic "1" are balanced through the insertion signals $INS_1$-$INS_K$, the scheduler 120 provides the requirement signal REQ to the decoder 110, to notify the decoder 110 that no DC balance codes need to be inserted.

Furthermore, the DC balance codes $CODE_1$-$CODE_K$ provided by the determining units $140_1$-$140_K$ may be identical or different. In FIG. 2, the address data $ADDR_1$-$ADDR_K$ and the command data $CMD_1$-$CMD_K$ share the same transmission line. For example, the address data $ADDR_1$ and the command data $CMD_1$ share the transmission line $160_1$ of the bus 150, and the address data $ADDR_K$ and the command data $CMD_K$ share the transmission line $160_K$ of the bus 150. In one embodiment, the address data $ADDR_1$-$ADDR_K$ and the command data $CMD_1$-$CMD_K$ may not share the same transmission line. For example, each of the address data $ADDR_1$-$ADDR_K$ and each of the command data $CMD_1$-$CMD_K$ are transmitted to the memories via different selectors, different transmission lines of bus 150 and different drivers.

Figure 3:
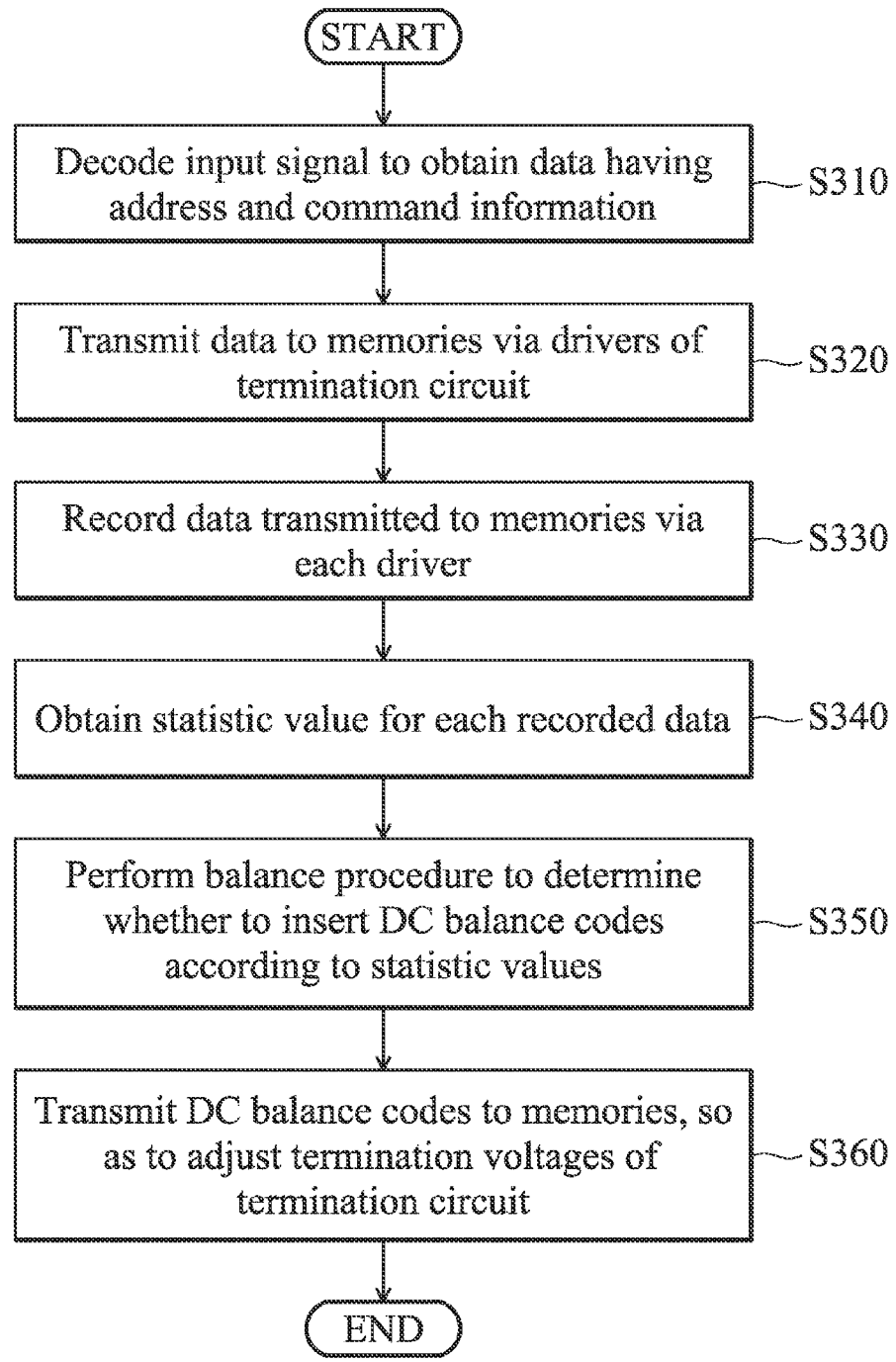
FIG. 3 shows a DC balance method for a memory system according to an embodiment of the invention, wherein the memory system comprises a controller, a termination circuit and a plurality of memories.

FIG. 3 shows a direct current (DC) balance method for a memory system according to an embodiment of the invention, wherein the memory system comprises a controller (e.g. 10 of FIG. 1), a termination circuit (e.g. 60 of FIG. 1) and a plurality of memories (e.g. $30_1$-$30_M$ of FIG. 1). First, in step S310, an input signal IN is decoded by a decoder (e.g. 110 of FIG. 2) of the controller, to obtain data having address and command information (e.g. $ADDR_1$-$ADDR_K$ and $CMD_1$-$CMD_K$ of FIG. 2). Next, in step S320, the controller transmits the data to the memories via the drivers (e.g. $20_1$-$20_N$ of FIG. 1) of the termination circuit. Next, in step S330, the controller records the data transmitted to the memories via each driver. Next, in step S340, for each of the recorded data, the controller obtains a statistic value regarding a quantity of logic "0" and a quantity of logic "1" of the recorded data. Next, in step S350, the controller performs a balance procedure to determine whether to insert the DC balance codes according to the statistic values. Next, in step S360, the controller transmits the DC balance codes to the memories via the drivers when the statistic value indicates that a quantity of logic "0" and a quantity of logic "1" of the recorded data transmitted to the memories via one of the drivers are unbalanced, so as to adjust the termination voltages of the termination circuit, or more particularly, adjust the termination voltage corresponding to the one of the drivers.

Figure 4:
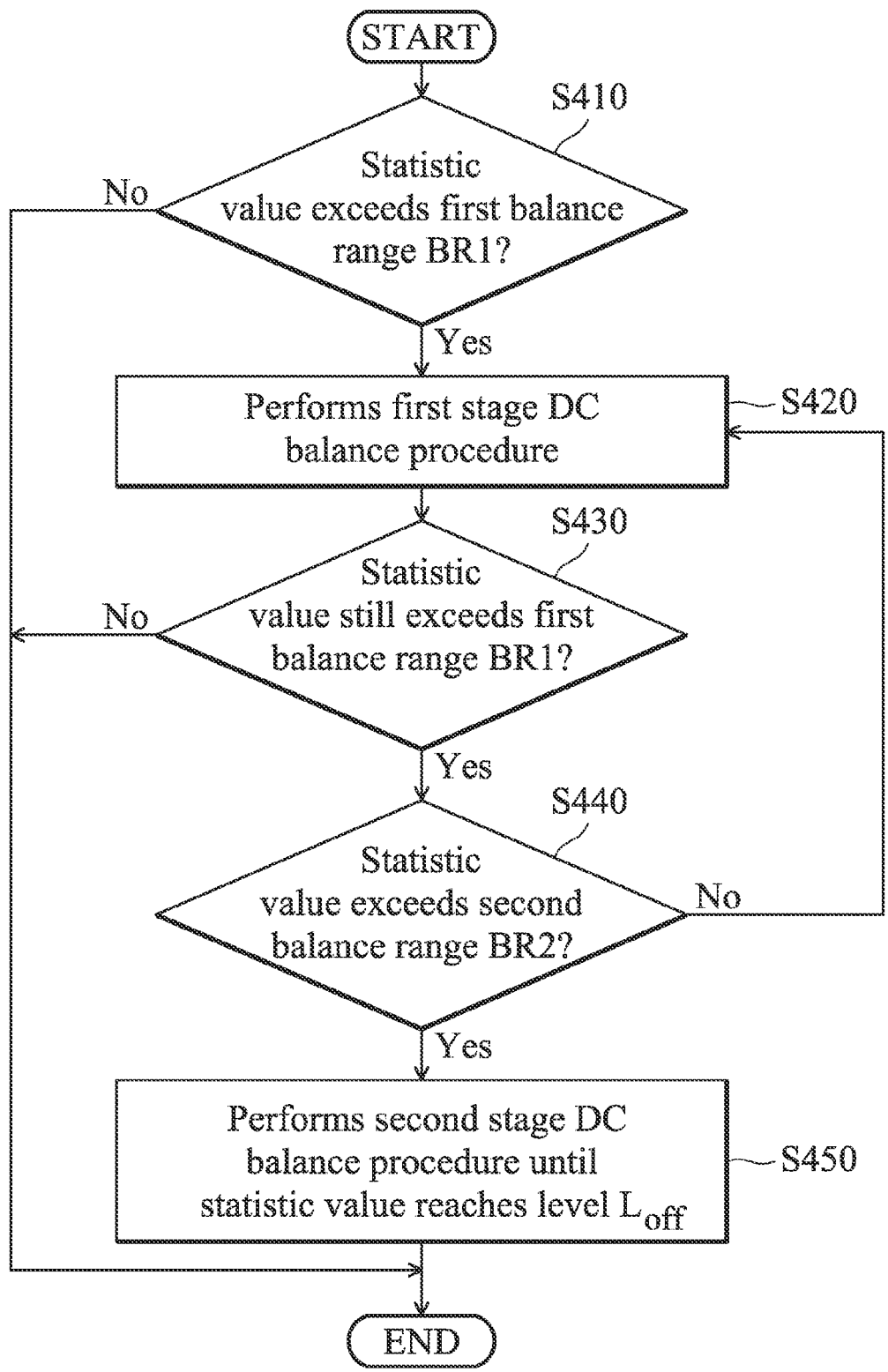
FIG. 4 shows a flowchart illustrating a balance procedure executed by the controller of FIG. 2 according to an embodiment of the invention.
Figure 5:
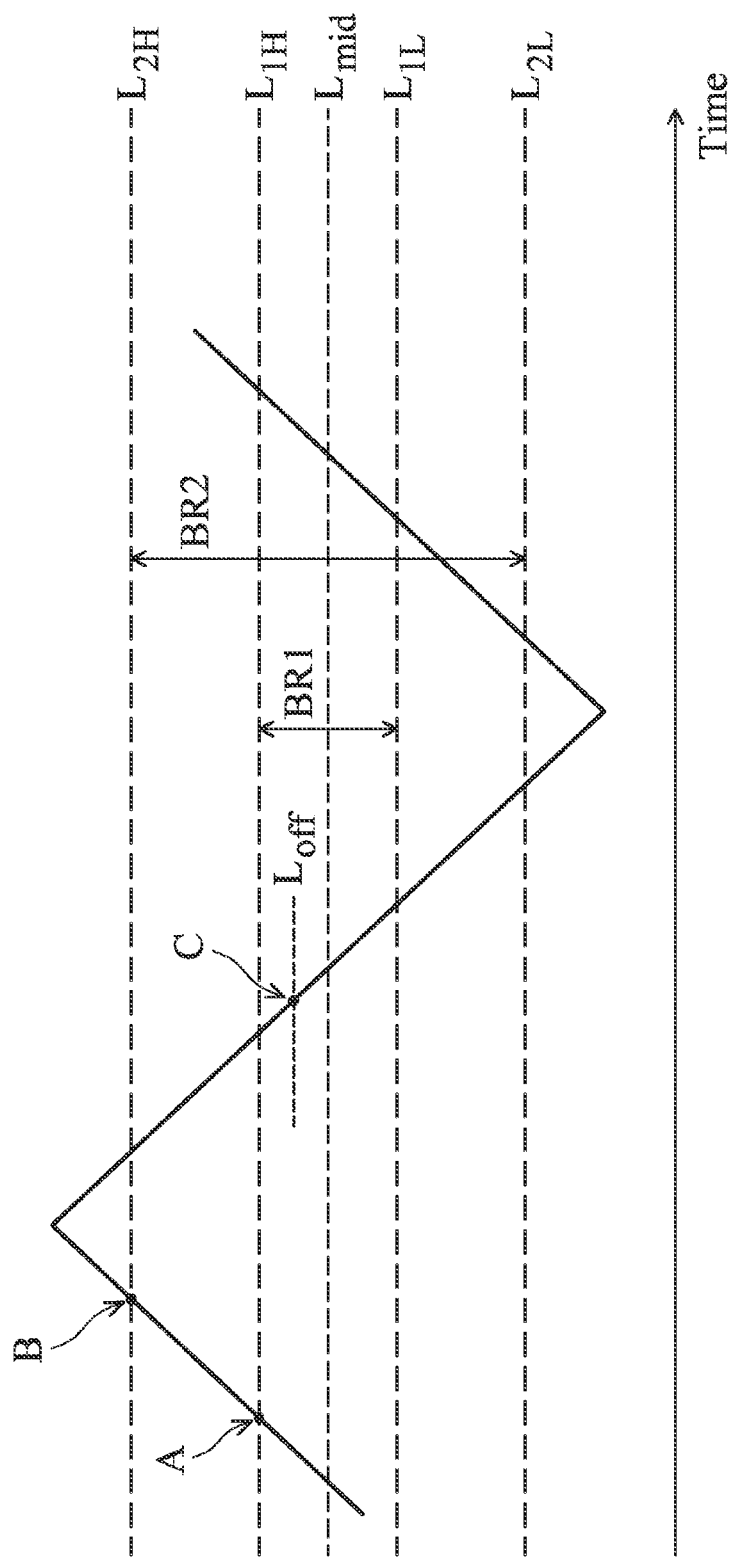
FIG. 5 shows an example schematic illustrating a statistic value obtained by one determining unit of the controller of FIG. 2.

FIG. 4 shows a flowchart illustrating a balance procedure executed by the controller 10 of FIG. 2 according to an embodiment of the invention. FIG. 5 shows an example schematic illustrating a statistic value obtained by the determining unit $140_1$ of FIG. 2. In the controller 10, the determining unit $140_1$ may use a low pass filter (LPF) to integrate the recorded data, to obtain the statistic value. Referring to FIG. 2, FIG. 4 and FIG. 5 together, first, the determining unit $140_1$ detects whether the statistic value exceeds a first balance range BR1 (step S410). The levels $L_{1H}$ and $L_{1L}$ are the upper and lower bounds of the first balance range BR1 for a first stage DC balance procedure, respectively, and level $L_{mid}$ is a mid level between the levels $L_{1H}$ and $L_{1L}$. If the statistic value does not exceed the first balance range BR1, no DC balance code needs to be inserted. If the statistic value does exceed the first balance range BR1, for example, the statistic value reaches the levels $L_{1H}$, as shown in label A of FIG. 5, the determining unit $140_1$ provides the insertion signal $INS_1$ to the scheduler 120, to notify the scheduler 120 that the statistic value has exceeded the first balance range BR1. Thus, the scheduler 120 provides the requirement signal REQ to the decoder 110. Next, in step S420, the decoder 110 performs a first stage DC balance procedure, to stop providing the address data $ADDR_1$ and the command data $CMD_1$-$CMD_K$ to the selectors $130_1$-$130_K$. Simultaneously, the decoder 110 provides the control signal SEL at an appropriate time point to insert the DC balance codes from the determining units $140_1$-$140_K$ into the bus 150. Specifically, the controller 10 does not insert the DC balance codes into the bus 150 immediately. Next, in step S430, the determining unit $140_1$ continuously records the data on the transmission line $160_1$ and obtains the statistic value according to the recorded data, so as to detect whether the statistic value still has exceeded the first balance range BR1. If the statistic value returns back to the first balance range BR1, the determining unit $140_1$ provides the insertion signal $INS_1$ to the scheduler 120, to notify the scheduler 120 that the statistic value is not exceeding the first balance range BR1. Next, the scheduler 120 provides the requirement signal REQ to the decoder 110, so as to stop performing the first stage DC balance procedure (i.e. stop inserting the DC balance codes into the bus 150). If the statistic value still exceeds the first balance range BR1, the determining unit $140_1$ further detects whether the statistic value has exceeded a second balance range BR2 (step S440). The levels $L_{2H}$ and $L_{2L}$ are the upper and lower bounds of the second balance range BR2 for a second stage DC balance procedure, respectively. Similarly, the level $L_{mid}$ is also a mid level between the levels $L_{2H}$ and $L_{2L}$. Furthermore, the level $L_{2H}$ is higher than the level $L_{1H}$, and the level $L_{2L}$ is lower than the level $L_{1L}$. If the statistic value has not exceeded the second balance range BR2, step S420 is performed, and then the decoder 110 continues to perform the first stage DC balance procedure. On the contrary, if the statistic value has exceeded the second balance range BR2, for example, the statistic value reaches the levels $L_{2H}$, as shown in label B of FIG. 5, the determining unit $140_1$ provides the insertion signal $INS_1$ to the scheduler 120, to notify the scheduler 120 that the statistic value has exceeded the second balance range BR2. Thus, the scheduler 120 provides the requirement signal REQ to the decoder 110, and the decoder 110 performs the second stage DC balance procedure (step S450), to immediately provide the control signal SEL to the selectors $130_1$-$130_K$ for immediate insertion into the DC balance codes until the determining unit $140_1$ detects that the statistic value has reached a level $L_{off}$, as shown in label C of FIG. 5. In the embodiment, the level $L_{off}$ is one level among the first balance range BR1. Furthermore, the level $L_{off}$ may be a level larger or smaller than the level $L_{mid}$. Moreover, for each of the determining units $140_1$-$140_K$, the levels $L_{1H}$ and $L_{1L}$, the levels $L_{2H}$ and $L_{2L}$ and the level $L_{off}$ may be set according to actual applications.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A termination circuit for a plurality of memories controlled by a controller, comprising:
   a plurality of drivers, each coupled to the memories via a transmission line;
   a plurality of resistors, each coupled to the corresponding driver via the corresponding transmission line; and
   a plurality of capacitors, each having a first terminal coupled to the corresponding resistor and a second terminal coupled to a reference voltage, wherein the first terminal of each capacitor is electrically separated from the first terminals of the other capacitors,
   wherein the controller is coupled to the memories via the drivers, and the controller provides a specific code to one of the drivers when a quantity of logic "0" and a quantity of logic "1" transmitted to the memories via the transmission line corresponding to the one of the drivers are unbalanced, so as to adjust a termination voltage of the capacitor corresponding to the one of the drivers.

2. The termination circuit as claimed in claim 1, wherein the controller further provides data to the memories via the drivers, wherein the controller further records the data provided to the memories via each of the drivers and obtains a plurality of statistic values according to a quantity of logic "0" and a quantity of logic "1" of the recorded data.

3. The termination circuit as claimed in claim 2, wherein when the statistic value corresponding to the one of the drivers exceeds a specific range, the controller provides the specific code to the one of the drivers.

4. The termination circuit as claimed in claim 2, wherein when the statistic value corresponding to the one of the drivers exceeds a specific range, the controller provides the specific code to all of the drivers, so as to adjust the termination voltages of the capacitors.

5. The termination circuit as claimed in claim 1, wherein the specific code is a DC balance code, a scrambling code or a modulation code.

6. The termination circuit as claimed in claim 1, wherein the controller comprises:
   a decoder, decoding an input signal to provide data having address and command information for the memories; and
   a plurality of selectors coupled between the decoder and the drivers, each of the selector selectively providing the data or the specific code to the corresponding driver according to a control signal.

7. The termination circuit as claimed in claim 6, wherein the controller further comprises:
   a scheduler, providing a requirement signal to the decoder in response to a insertion signal; and
   a plurality of determining units, each coupled to the corresponding selector and the corresponding driver,
   wherein each of the determining units records data output by the corresponding selector to obtain a statistic value, provides the specific code to the corresponding selector, and provides the insertion signal to the scheduler when the statistic value indicates that the quantity of logic "0" and the quantity of logic "1" of the recorded data are unbalanced.

8. The termination circuit as claimed in claim 7, wherein after receiving the requirement signal, the decoder stops providing the data and provides the control signal to the selector corresponding to the determining unit that provides the insertion signal, so as to control the selector to provide the specific code to the corresponding driver.

9. The termination circuit as claimed in claim 7, wherein after receiving the requirement signal, the decoder stops providing the data and provides the control signal to the selectors, so as to control the selectors to provide the specific codes from the determining units to the drivers, so as to adjust the termination voltages of the capacitors.

10. The termination circuit as claimed in claim 1, wherein the reference voltage is a supply voltage or a grounding voltage, and the controller provides the specific code to the one of the drivers, so as to adjust the termination voltage of the capacitor corresponding to the one of the drivers, whereby the level of the termination voltage is approximately at a mid-point level between the supply voltage and the grounding voltage.

11. The termination circuit as claimed in claim 1, wherein the memories are double data rate dynamic random access memories.

12. A direct current (DC) balance method for a termination circuit of a plurality of memories, wherein the termination circuit comprises a plurality of drivers coupled to the memories via a plurality of transmission lines, a plurality of resistors each coupled to the corresponding driver via the corresponding transmission line, and a plurality of capacitors each coupled between the corresponding resistor and a reference voltage, comprising:
  decoding an input signal to obtain data having address and command information;
  providing the data to the memories via the drivers; and
  providing a specific code to the memories via one of the drivers when a quantity of logic "0" and a quantity of logic "1" of the data provided to the memories via the one of the drivers are unbalanced, so as to adjust a termination voltage of the capacitor corresponding to the one of the drivers,
  wherein each capacitor has a first terminal coupled to the corresponding resistor and a second terminal coupled to the reference voltage, and the first terminal of each capacitor is electrically separated from the first terminals of the other capacitors.

13. The DC balance method as claimed in claim 12, further comprising:
  recording the data provided to the memories via each of the drivers; and
  obtaining a statistic value according to a quantity of logic "0" and a quantity of logic "1" of each of the recorded data.

14. The DC balance method as claimed in claim 13, wherein when the statistic value corresponding to the one of the drivers exceeds a specific range, the specific code is provided to the memories via the one of the drivers.

15. The DC balance method as claimed in claim 13, wherein when the statistic value corresponding to the one of the drivers exceeds a specific range, the specific code is provided to the memories via all of the drivers, so as to adjust the termination voltages of the capacitors.

16. The DC balance method as claimed in claim 13, wherein the step of providing the specific code to the memories via the one of the drivers further comprises:
  providing the specific code during a idle cycle for the memories when one of the statistic values exceeds a first range between a first level and a second level lower than the first level; and
  immediately providing the specific code when the one of the statistic values exceeds a second range between a third level and a fourth level lower than the third level, wherein the third level is higher than the first level and the fourth level is lower than the second level.

17. The DC balance method as claimed in claim 12, wherein the specific code is a DC balance code, a scrambling code or a modulation code.

18. The DC balance method as claimed in claim 13, further comprising:
  selectively providing the data or the specific code to the memories via the one of the drivers according to a control signal.

19. The DC balance method as claimed in claim 18, further comprising:
  obtaining a requirement signal when the statistic value indicates that the quantity of logic "0" and the quantity of logic "1" of the recorded data provided to the memories via the one of the drivers are unbalanced.

20. The DC balance method as claimed in claim 19, wherein the step of providing the specific code to the memories via the one of the drivers further comprises:
  stopping the providing of data to the memories in response to the requirement signal; and
  obtaining the control signal in response to the requirement signal, so as to provide the specific code to the memories via the one of the drivers.

21. The DC balance method as claimed in claim 13, further comprising:
  selectively providing the data or the specific code to the memories via all of the drivers according to a control signal.

22. The DC balance method as claimed in claim 21, further comprising:
  obtaining a requirement signal when one of the statistic values indicate that the quantity of logic "0" and the quantity of logic "1" of the recorded data provided to the memories via the corresponding driver are unbalanced.

23. The DC balance method as claimed in claim 22, wherein the step of providing the specific code to the memories further comprises:
  stopping the providing of data to the memories in response to the requirement signal; and
  obtaining the control signal in response to the requirement signal, so as to provide the specific code to the memories via all of the drivers.

24. The DC balance method as claimed in claim 12, wherein the reference voltage is a supply voltage or a grounding voltage, and the specific code is provided to the memories via the one of the drivers, so as to adjust the termination voltage of the capacitor corresponding to the one of the drivers, whereby the level of the termination voltage is approximately at a mid-point level between the supply voltage and the grounding voltage.

25. The DC balance method as claimed in claim 12, wherein the memories are double data rate dynamic random access memories.

* * * * *